United States Patent [19]
Jha et al.

[11] Patent Number: 5,854,565
[45] Date of Patent: Dec. 29, 1998

[54] LOW POWER LATCH REQUIRING REDUCED CIRCUIT AREA

[75] Inventors: Sanjay K. Jha; Jian Lin, both of San Diego, Calif.

[73] Assignee: Qualcomm Incorporated, San Diego, Calif.

[21] Appl. No.: 881,555

[22] Filed: Jun. 24, 1997

Related U.S. Application Data

[63] Continuation of Ser. No. 539,981, Oct. 6, 1995, abandoned.

[51] Int. Cl.$^6$ .................................................. H03K 3/289
[52] U.S. Cl. ............................ 327/202; 327/203; 327/211
[58] Field of Search .................................... 327/199–204, 327/208–214

[56] References Cited

U.S. PATENT DOCUMENTS

| | | | |
|---|---|---|---|
| 4,495,629 | 1/1985 | Zasio et al. | 377/70 |
| 4,554,467 | 11/1985 | Vaughn | 327/211 |
| 5,015,875 | 5/1991 | Giles et al. | 307/272.2 |
| 5,130,568 | 7/1992 | Miller et al. | 307/272.2 |
| 5,175,447 | 12/1992 | Kawasaki et al. | 307/480 |
| 5,444,404 | 8/1995 | Ebzery | 327/185 |
| 5,461,331 | 10/1995 | Schorn | 327/210 |

FOREIGN PATENT DOCUMENTS

| | | | |
|---|---|---|---|
| WO 93/19528 | 9/1993 | European Pat. Off. | 327/210 |
| 1-89810 | 4/1989 | Japan | 327/203 |
| 1-309510 | 12/1989 | Japan | 327/199 |
| 3-201717 | 9/1991 | Japan | 327/199 |
| 4-225614 | 8/1992 | Japan | 327/202 |
| 5-75401 | 3/1993 | Japan | 327/203 |
| 5-152905 | 6/1993 | Japan | 327/210 |
| 5-259834 | 10/1993 | Japan | 327/208 |
| 6-188694 | 4/1994 | Japan | 327/199 |
| 6-188695 | 7/1994 | Japan | 327/202 |

*Primary Examiner*—Timothy P. Callahan
*Assistant Examiner*—Tuan T. Lam
*Attorney, Agent, or Firm*—Russell B. Miller; Brian S. Edmonston

[57] ABSTRACT

The present invention is a novel and improved method and apparatus for implementing a latch within an integrated circuit. Data is stored on a storage node via the application of either a first or second state logic source applied through a feedback inverter that maintains the storage node at a particular logic state. During logic transitions from a first state to a second state the storage node is decoupled from the first state logic source via the use of a gating circuit, and the new logic level is applied to the storage node. During logic transitions from the second state to the first state the storage node remains coupled to the second state logic source. The coupling and decoupling of the storage node from the first state logic source is performed via the use of a clock signal that has a non-overlapping cycle with respect to a second clock signal that is used to control the transitions of the state of the latch.

11 Claims, 3 Drawing Sheets

5,854,565

LOW POWER LATCH REQUIRING REDUCED CIRCUIT AREA

This is a continuation of application Ser. No. 08/539,981, filed Oct. 6, 1995, now abandoned.

BACKGROUND OF THE INVENTION

I. Field of the Invention

The present invention relates to integrated circuits. More particularly, the present invention relates to a novel and improved method and apparatus for implementing a low power latch requiring reduced circuit area within an integrated circuit.

II. Description of the Related Art

FIG. 1 is a circuit diagram of a prior art latch design that is implemented with a minimal number of transistors. A latch is used to provide data storage within an integrated circuit. During normal operation, data is read in at data input node 10 and read out at data out node 42, and during testing, data is read in at serial-data input node 18. When the latch is in a first state, a logic low is stored on storage node 22 and a logic high is stored on storage node 32. In a second state a logic high is stored on storage node 22, and a logic low is stored on storage node 32. Feedback nodes 24 and 34 are placed at opposite logic levels to storage nodes 22 and 32 by storage inverters 26 and 28, and cause feedback inverters 36 and 38 to assert logic levels of like kind on storage nodes 22 and 32. The logic level at data input node 10 is applied to storage node 22 by gating n-channel transistor 14 which is controlled by clock signal Ø1 and data input buffer 12, and the logic level of serial data input node 18 is applied to storage node 22 by gating n-channel transistor 20 which is controlled by clock signal Øs and serial input buffer 16. The logic level from storage inverter 26 is applied to storage node 32 via gating n-channel transistor 39 which is controlled by clock signal Ø2. Clock signals Ø1 and Ø2 are non-overlapping clock signals, and Øs is a test clock signal that should be non-overlapping with respect to clock signal Ø2, the use of which is well known in the art. Output buffer 40 sets data output node 42 to the opposite logic level of feedback node 34.

The state of the latch is controlled by the logic level applied to data input node 10. A transition of the logic level on data input node 10 first causes input buffer 12 to switch the logic level on input node 13. This sets the logic level of input node 13 to the opposite of that on storage node 22, which is set according to logic level of data input node 10 before transition. Additionally, the logic level on input node 13 will be the opposite of that asserted by feedback inverter 36, which as noted above asserts a logic level of like kind to that on storage node 22. When clock signal Ø1 goes logic high, the logic level applied to input node 13 by input buffer 12 is also applied to storage node 22. At this point, input buffer 12 and feedback inverter 36 assert opposite logic levels on storage node 22. Input buffer 12 is configured with larger dimensions, however, such that it will switch the logic level on storage node 22, which in turn will cause storage inverter 26 to switch the logic level on feedback node 24. Feedback inverter 36 responds to the new logic level on feedback node 24 by asserting a logic level of the same kind as being asserted by input buffer 12, thus holding storage node 22 at this logic level when clock signal Ø1 becomes logic low, therefore decoupling storage node 22 from input buffer 12. In a similar fashion, the new logic level asserted by storage inverter 26 is applied through gating n-channel transistor 39 when clock signal Ø2 is logic high, and this new logic level will be the opposite level of that on storage node 32 and asserted by feedback inverter 38. Storage inverter 26 is also configured with dimensions sufficient to transition the logic level on storage node 32, which in turn causes storage inverter 28 to switch the logic level on feedback node 34. This causes feedback inverter 38 to assert the same logic level as storage inverter 26, thus maintaining that logic level on storage node 32 once clock signal Ø2 goes logic low.

FIG. 2 is a circuit diagram of a prior art latch circuit configured for reduced power consumption. As is apparent, the latch of FIG. 2 is implemented using a greater number of transistors when compared to the latch of FIG. 1. During the normal operation of the latch shown in FIG. 2 data is read in at data input node 100 and read out at data output node 192, and during testing, data is read in at serial-data input node 118. When the latch is in a first state, storage node 122 is logic high and storage node 142 is logic low. When the latch is in a second state, storage node 122 is logic low and storage node 142 is logic high. Clock signal inverters 134, 154, and 184 generate inverse Ø1 clock signal 138, inverse Ø2 clock signal 158, and inverse Øs clock signal 186, respectively. Storage node 122 is coupled to the outputs of input buffer 102, feedback inverter 130, and serial input buffer 180 via complimentary gates 113, 115, and 117. Complementary gate 113 is comprised of n-channel transistor 112 and p-channel transistor 128 which are controlled by clock signal Ø1 and inverse Ø1 clock signal 138 respectively, and therefore applies the logic level asserted by feedback inverter 130 to storage node 122 when clock signal Ø1 is logic low. Complementary gate 115 is comprised of n-channel transistor 132 and p-channel transistor 108 which are controlled by clock signal Ø1 and inverse Ø1 clock signal 138 respectively, and therefore applies the logic level from input buffer 102 to storage node 122 when clock signal Ø1 is logic high. Complementary gate 117 is comprised of n-channel transistor 182 and p-channel transistor 182 which are controlled by clock signal Øs and inverse Øs clock signal 186 respectively, and therefore applies the logic level from serial data input buffer 180 to storage node 122 when the clock signal Øs is logic high.

Storage node 142 is coupled to feedback node 124 and to feedback inverter 150 via complementary gates 170 and 171. Complimentary gate 170 is comprised of n-channel transistor 174 and p-channel transistor 172 which receive clock signal Ø2 and inverse Ø2 clock signal 158 respectively, and therefore applies the output of storage inverter 126 to storage node 142 when clock signal Ø2 is logic high. Complimentary gate 171 is comprised of n-channel transistor 149 and p-channel transistor 148 which receive inverse Ø2 clock signal 158 and clock signal Ø2 respectively, and therefore couples the output of feedback inverter 150 to storage node 142 when clock signal Ø2 is logic low. Feedback node 144 is coupled to the inputs of feedback inverter 150 and output buffer 190, as well as the output of storage inverter 146.

When the logic level on input node 100 remains steady, data input buffer 102 asserts a steady logic level on storage node 122 when clock signal Ø1 is logic high. The logic level on storage node 122 causes storage inverter 126 to assert the opposite logic level on feedback node 124, which in turn causes feedback inverter 130 to assert a logic level of like kind to that asserted by input buffer 102 on storage node 122 when clock signal Ø1 is logic low. Complimentary gate 170 applies the logic level from feedback inverter 126 to storage node 142 when clock signal Ø2 is logic high, which in turn causes storage inverter 146 to assert the opposite logic level on feedback node 144. The logic level on feedback node 144 causes feedback inverter 150 to assert a logic level of like kind to that asserted by feedback inverter 126 on storage node 142 when clock signal Ø2 is logic low. Output buffer 190 receives the logic level on feedback node 144, and asserts the opposite logic level on output node 192.

When the logic level applied at data input node 100 transitions, the logic level asserted by input buffer 102 transitions as well, placing it at the opposite logic level to that asserted by feedback buffer 130. The new logic level is applied to storage node 122 by complimentary gate 115 when clock signal Ø1 goes logic high. Simultaneously, complimentary gate 113 decouples feedback inverter 130 from storage node 122, thus preventing feedback inverter 130 from continuing to assert a logic level that is the opposite of that asserted by input buffer 102. This allows input buffer 102 to set the logic level of storage node 122 without any resistance from feedback inverter 130. Switching the logic level of storage node 122 causes storage inverter 126 to switch the logic level of feedback node 124. The new logic level on feedback node 124 causes feedback inverter 130 to once again assert the same logic level asserted by input buffer 102, which is applied to storage node 122 when clock signal Ø1 is logic low. When clock signal Ø2 is logic high, complementary gate 170 applies the logic level on feedback node 124 to storage node 142 while complimentary gate 171 decouples feedback inverter 150 from storage node 142. This switches the logic level on storage node 142 causing storage inverter 146 to change the logic level of feedback node 144, which in turn causes feedback inverter 150 to assert the same logic level as storage inverter 126. This maintains the logic level on storage node 142 when clock signal Ø2 goes logic low. Test data is input via application to serial-data input node 118, and by applying clock signal Øs instead of clock signal Ø1.

The latch of FIG. 2 provides the advantage of reduced power consumption when compared to the latch shown in FIG. 1. This reduced power consumption is provided, however, via the use of a substantial number of additional transistors. More particularly, the latch of FIG. 1 requires seventeen transistors, given that each buffer and inverter requires two transistors, while the latch of FIG. 2 requires thirty. While these two latch circuits have generally been found to provide sufficient flexibility for implementing digital integrated circuits fulfilling a range of performance requirements, the recent increase in the number of portable digital processing systems that are powered using a battery or other energy storage device has created the need for integrated circuits that are both smaller in size, and consume reduced amounts of power. In particular, wireless telephones including wireless cellular telephone systems must consume as little power as possible in order to extend battery life, and must remain highly compact for purposes of portability. The use of either of the prior art latches described above will not provide an integrated circuit having this combination of characteristics. Therefore, a latch that can be implemented with a reduced number of circuits, while simultaneously providing reduced power consumption, is highly desirable.

SUMMARY OF THE INVENTION

The present invention is a novel and improved method and apparatus for implementing a latch within an integrated circuit. Data is stored on a storage node via the application or either a first or second state logic source. The logic level is maintained on the storage node via the application of a first logic source or a second logic source using a feedback inverter coupled to the storage node. During logic transitions from a first state, to a second state, the storage node is decoupled from the first logic source via the use of a gating circuit, and the new logic level is applied to the storage node. During logic transitions from the second state to the first state, the storage node remains coupled to the second state logic source. The coupling and decoupling of the storage node from the first state logic source is performed via the use of a clock signal that has a non-overlapping cycle with respect to a second clock signal that is used to control the transitions of the state of the latch.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENT

Figure 1:
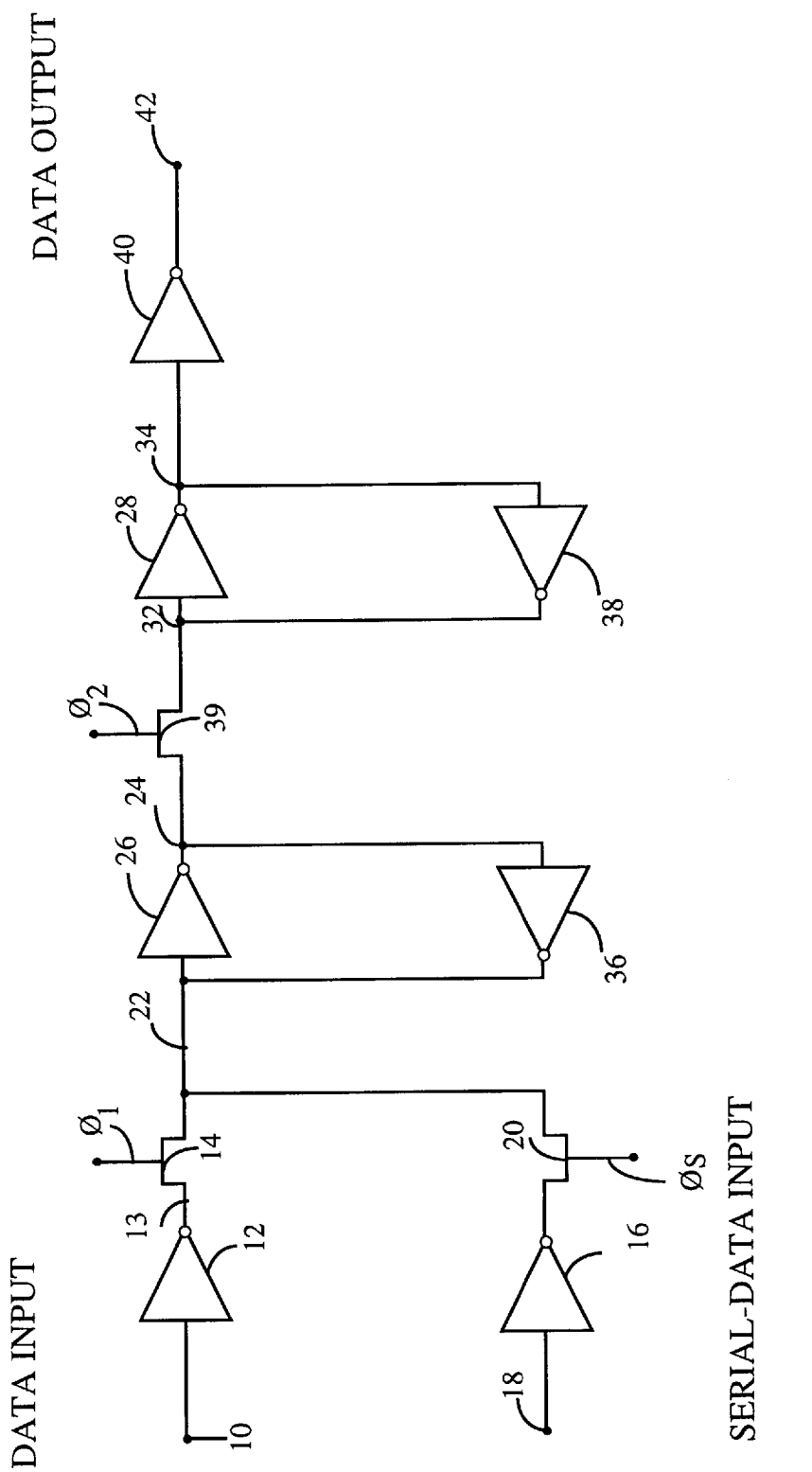
FIG. 1 is a circuit diagram of a prior art latch configured to occupy minimal circuit area.
Figure 2:
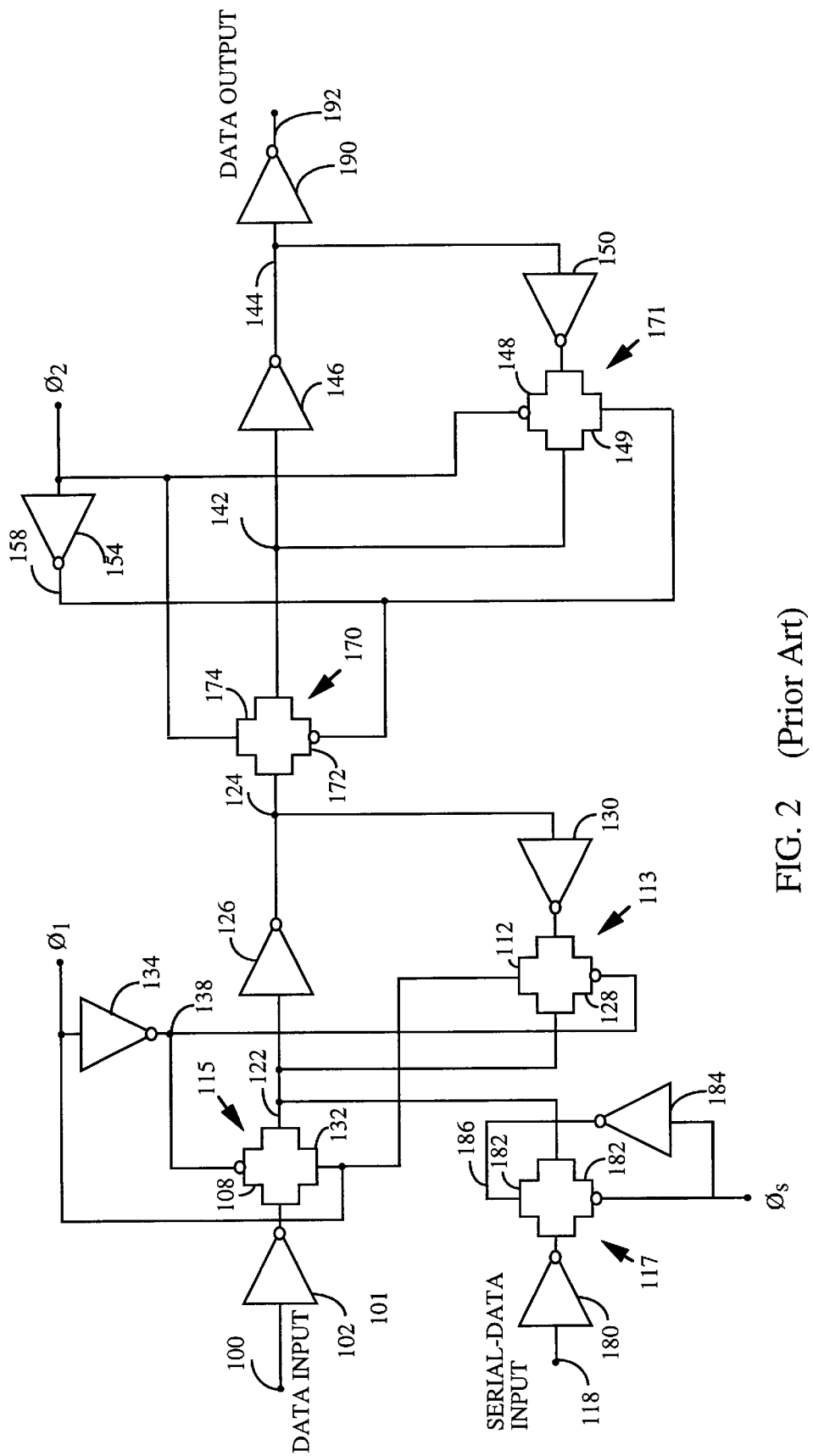
FIG. 2 is a circuit diagram of a prior art latch configured for minimal power consumption.
Figure 3:
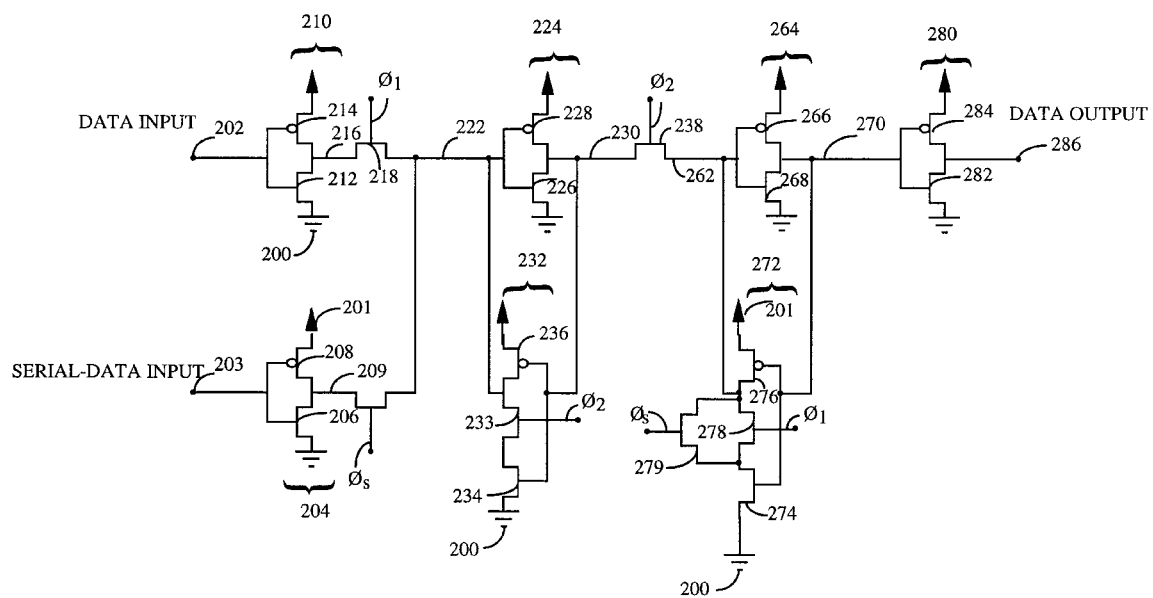
FIG. 3 is a circuit diagram of a latch configured in accordance with one embodiment of the invention.

FIG. 3 is a circuit diagram of a latch configured in accordance with one embodiment of the invention. During normal operation, data is read in at data input node 202 and read out at data output node 286, and during testing data is read in at serial-data input node 203. When the latch is in a first state, storage node 222 is logic low and storage node 262 is logic high. In a second state storage node 222 is logic high and storage node 262 is logic low. Storage inverter 224 is comprised of n-channel transistor 226 and p-channel transistor 228 and places feedback node 230 at the opposite logic level of storage node 222. Storage inverter 264 is comprised of n-channel transistor 266 and p-channel transistor 268 and places feedback node 270 at the opposite logic level of storage node 262. Feedback inverter 232 is comprised of n-channel transistor 234 and p-channel transistor 236 and feedback inverter 272 is comprised of n-channel transistor 274 and p-channel transistor 276. Gating n-channel transistor 233 couples n-channel transistor 234 to storage node 222, and gating n-channel transistor 278 and gating p-channel transistor 279 couple storage node 262 to n-channel transistor 274. Data input buffer 210 is comprised of n-channel transistor 212 and p-channel transistor 214 and asserts a logic level on input node 216 that is the opposite of that asserted on data input node 202, and which is applied to storage node 222 via gating n-channel transistor 218. Similarly, serial-data input buffer 204 is comprised of n-channel transistor 206 and p-channel transistor 208 and asserts a logic level on serial input node 209 that is the opposite of that asserted on serial-data input node 203, and which is applied to storage node 222 via gating n-channel transistor 238. Data output buffer 280 is comprised of n-channel transistor 282 and p-channel transistor 284, and asserts a logic level on data out node 286 that is the opposite that on feedback node 270.

As noted above a logic low on storage node 222 causes storage inverter 224 to assert the opposite logic value, and therefore a logic high, on feedback node 230. The logic high on feedback node 230 turns off p-channel transistor 236 of feedback inverter 232, and turns on n-channel transistor 234. Turning on n-channel transistor couples storage node 222 to logic low voltage source 200 through n-channel transistor 234 and gating n-channel transistor 233 when clock signal Ø2 is logic high, thereby acting to maintain the logic low on storage node 222. When the logic level on storage node 222 is logic high, this causes a logic low to be placed on feedback node 230 by storage inverter 224, which in turn turns on p-channel transistor 236 and turns off n-channel transistor 234. This couples storage node 222 to logic high voltage source 201 via p-channel transistor 214 thereby maintaining the logic high on storage node 222. Feedback inverter 272 operates in a similar manner by coupling storage node 262 to logic low voltage source 200 via gating n-channel transistor 278 and n-channel transistor 274 when a logic low is stored on storage node 262 and clock signal Ø1 is logic high, and by coupling storage node 262 to logic high voltage source 201 via p-channel transistor 276 when a logic high is stored on storage node 262.

A transition on data input node 202 causes a transition in the state of the latch shown in FIG. 3. If the transition is from logic high to logic low, p-channel transistor 214 is turned off and n-channel transistor 212 is turned on. This couples input node 216 to logic low voltage source 200 which is the opposite logic level of storage node 222. Storage node 222 will be coupled to logic high voltage source 201 via p-channel transistor 236, and therefore set logic high as described above in accordance with the logic level applied to data input node 202 before the transition. When clock signal Ø1 goes logic high storage node 222 is coupled to logic low voltage source 200 via n-channel transistor 212 and gating n-channel transistor 218, as well as to logic high voltage source 201 via p-channel transistor 236. Because p-channel transistors in general provide more current resistance than n-channel transistors, and because n-channel transistor 212 and gating n-channel transistor 218 are configured with larger width to length ratios than p-channel transistor 236 in the preferred embodiment of the invention, the logic level of storage node 222 goes logic low, thus turning off n-channel transistor 226 and turning on p-channel transistor 228 of storage inverter 224. This places a logic high on feedback node 230 which turns off p-channel transistor 234 and turns on n-channel transistor 234 of feedback inverter 232, thereby coupling storage node 222 to logic low voltage source 200 when clock Ø2 is logic high.

If the transition on data input node 202 is from logic low to logic high, p-channel transistor 214 is turned on and n-channel transistor 212 is turned off after the transition. This sets input node 216 logic high by coupling it to logic high voltage source 201 via p-channel transistor 214. The logic high on input node 216 will be the opposite logic level of that placed on storage node 222, which will be set logic low and coupled to logic low voltage source 200 via n-channel transistor 234 and gating n-channel transistor 233 according to the logic level asserted on data-input node 202 before the transition before clock signal Ø2 is logic high. When clock signal Ø1 goes logic high, storage node 222 is coupled to logic high voltage source 201 via p-channel transistor 214. Since clock signals Ø1 and Ø2 are non-overlapping, clock signal Ø2 will be logic low at the time clock signal Ø1 is logic high, thereby eliminating any connection between storage node 222 and logic low voltage source 200 through feedback inverter 232. The elimination of any connection to storage node 222 other than the one to logic high voltage source 201 via p-channel transistor 214 and gating n-channel transistor 218, allows storage node 222 to be placed in a logic high state without any flow of current, and therefore any associated power consumption, beyond that necessary to remove any current stored within storage node 222 resulting from inherent capacitance. Once storage node 222 becomes logic high storage inverter 224 places feedback node 230 logic low. This logic low turns off n-channel transistor 234 and turns on p-channel transistor 236, thus coupling storage node 222 to logic high voltage source 201 via p-channel transistor 236, and therefore eliminating any connection to logic low voltage source 200 via gating n-channel transistor 233 when clock signal Ø2 goes logic high.

The transition of the logic level on storage node 262 operates in much the same manner as that on storage node 222. A transition from low to high on storage node 222 turns off p-channel transistor 228 and turns on n-channel transistor 226 of inverter 224, thus coupling feedback node 230 to the logic low voltage source. This places feedback node 230 at the opposite logic level of storage node 262, which will be set logic high and coupled to logic high voltage source 201 via p-channel transistor 276 of feedback inverter 272 in accordance with the state of the latch before the transition at data-input node 202. When clock signal Ø2 goes logic high, storage node 230 is coupled to logic low voltage source 200 through gating n-channel transistor 238 and n-channel transistor 226. Gating n-channel transistor 238 and n-channel transistor 226 have sufficiently lower resistance, and are configured with sufficiently higher width to length ratios as compared to p-channel transistor 276 to cause storage node 262 to go logic low despite the coupling to logic high voltage source 201 via p-channel transistor 276. The logic low on storage node 262 turns on p-channel transistor 266 and turns off n-channel transistor 268 thus coupling feedback node 270 to the logic high voltage source. This turns on n-channel transistor 278 and turns off p-channel transistor 276 of feedback inverter 272, thus coupling storage node 262 to gating n-channel transistor 278. This couples storage node 262 to logic low voltage source 200 when clock signal Ø1 is logic high.

A transition from high to low on storage node 222 turns on p-channel transistor 228 and turns off n-channel transistor 226, both of inverter 224, thus coupling feedback node 230 to the logic high voltage source. This places feedback node 230 at the opposite logic level of storage node 262, which is set logic low and coupled to logic low voltage source 200 via n-channel transistor 274 of feedback inverter 272 and gating n-channel transistor 278 in accordance with the state of the latch before the transition. When clock signal Ø2 goes logic high, storage node 230 is coupled to logic high voltage source 201 through gating n-channel transistor 238 and p-channel transistor 228. Since clock signal Ø1 is logic low when clock signal Ø2 is logic high, gating n-channel transistor 278 will be off and storage node 262 will be coupled to logic high voltage source 201 only, thus setting storage node 262 to a logic high using only the current necessary to overcome the inherent capacitance of storage node 262. The logic high on storage node 262 turns off p-channel transistor 266 and turns on n-channel transistor 268 of storage inverter 264, thus coupling feedback node 270 to the logic low voltage source. The logic low on feedback node 270 turns off n-channel transistor 278 and turns on p-channel transistor 276 of feedback inverter 272, thus coupling storage node 262 to logic high voltage source 201 and removing any connection to logic low voltage source 200 via gating channel transistor 278 when clock signal Ø1 goes logic high. The state of the latch shown in FIG. 3 may be also be altered in almost identical fashion via the application of a signal to serial-data input 280, and by disabling clock signal Ø1, and providing a second clock signal Øs which is also non-overlapping with respect to clock signal Ø2.

By coupling feedback inverters 232 and 272 to logic low voltage source 200 using gating n-channel transistors 233 and 278, which are controlled by clock signals Ø2 and Ø1 respectively, the above described latch provides data storage functionality via the use of a reduced number of transistors, and therefore circuit area, and also a reduced amount of power consumption. This is because for transitions from logic low to logic high on either of storage nodes 222 or 262, the coupling to logic low voltage source 200 via either feedback inverter 232 or 272 is eliminated before the coupling to logic high voltage source 201 via n-gating transistors 218 and 238, and p-channel transistors 214 and 228 is established. Eliminating the connection to ground allows the logic level on storage nodes 222 and 262 to be switched from logic low to logic high without creating a complete connection from logic high voltage source 201 to the logic low voltage source through the latch, and therefore without allowing excess current to flow. Because the present invention requires fewer transistors than prior art low power latch circuits, and each transistor consumes power during a transition, the present invention can have power consumption below that of these prior art latches in some circumstances, in addition to having reduced circuit area requirements.

To preserve circuit area, transitions from logic high to logic low on storage nodes 222 and 262 are allowed to create a complete connection from logic high voltage source 201 to logic low voltage source 200 and therefore some excess current to be conducted. However, because p-channel transistors in general have a higher resistivity than n-channel transistors, a transition from logic high to logic low will take place more rapidly on storage nodes 222 and 262 than a transition from low to high given the equivalent circuit configuration. This more rapid change will cause storage inverters 224 and 264 to more rapidly switch the logic levels on feedback nodes 230 and 270, which turns of p-channel transistors 236 and 276 and eliminates the current flow through the latch. Additionally, because the voltage level associated with a logic high is reduced as the logic high is passed through a p-channel transistor, decoupling storage nodes 222 and 262 from the logic low voltage source when a logic high is being applied provides more benefit than decoupling those nodes when a logic low is applied. Therefore, the described invention makes the most efficient use of each transistor. Thus, the above described latch eliminates the majority of the power consumption incurred by the reduced circuit area prior art latch also described above, via the use of only three additional transistors, making the total number of transistors nineteen. Therefore, only a minimal amount of additional circuit area is necessary to achieve described reduction in power consumption when compared to the other prior art latch described above.

Thus, an improved latch circuit has been described. Other latch circuits consistent with the above described invention will be apparent to one skilled in the art. The exemplary embodiment described above is provided merely for illustrative purposes, and should not be construed as limiting the scope of the invention.

We claim:

1. An integrated circuit connected between a data input line and a data output line, said integrated circuit comprising:

a first clock input line receiving a first clock signal;
a second clock input line receiving a second clock signal, with said first and second clock signals being non-overlapping with respect to one another;
a data input inverter having an input connected to the data input line;
a first n-channel gating transistor having an input connected to an output of said data input inverter and having a gate connected to said first clock input line;
a first data storage inverter having an input connected to an output of said first n-channel gating transistor;
a second n-channel gating transistor having an input connected to an output of said first data storage inverter and having a gate connected to said second clock input line;
a second data storage inverter having an input connected to an output of said second n-channel gating transistor;
a data output inverter having an input connected an output of said second data storage inverter and having an output connected to the data output line;
a first gated feedback inverter having a p-channel transistor, a first n-channel transistor and a second n-channel transistor connected serially in order with no other transistors between a voltage source and a ground, with said first n-channel transistor of said first gated feedback inverter having a gate connected to said second clock input line, said p-channel transistor and said second n-channel transistor of said first gated feedback inverter having gates connected to said output of said first data storage inverter, and said p-channel transistor of said first gated feedback inverter having a drain connected to said input of said first data storage inverter; and
a second gated feedback inverter having a p-channel transistor, a first n-channel transistor and a second n-channel transistor connected serially in order with no other transistors between the voltage source and the ground, with said first n-channel transistor of said second gated feedback inverter having a gate connected to said first clock input line, said p-channel transistor and said second n-channel transistor of said second gated feedback inverter having gates connected to said output of said second data storage inverter, and said p-channel transistor of said second gated feedback inverter having a drain connected to said input of said second data storage inverter.

2. The integrated circuit of claim 1 further comprising:

a third clock input line receiving a third clock signal, with said second and third clock signals being non-overlapping with respect to one another;
a serial-data input inverter having an input connected to a serial-data input line;
a third n-channel gating transistor connected between an output of said serial-data input inverter and said output of said first n-channel gating transistor and having a gate connected to said third clock input line; and
with said third clock input line also connected to a gate of a fourth n-channel transistor having a drain connected to said drain of said p-channel transistor of said second gated feedback inverter and a source connected to a drain of said second n-channel transistor of said second gated feedback inverter.

3. The integrated circuit of claim 1 wherein said n-channel transistors are less resistive than said p-channel transistors.

4. The integrated circuit of claim 1
wherein said data input inverter includes a p-channel transistor and an n-channel transistor connected in series between said voltage source and said ground; and
wherein said first n-channel gating transistor and said n-channel transistor of said data input inverter both have a greater ratio of width to length than said p-channel transistor of said first gated feedback inverter.

5. The integrated circuit of claim 1 wherein said first data storage inverter includes a p-channel transistor and an n-channel transistor connected in series between said voltage source and said ground; and wherein said second n-channel gating transistor and said n-channel transistor of said first data storage inverter both have a greater ratio of width to length than said p-channel transistor of said second gated feedback inverter.

6. An integrated circuit connected between a data input line and a data output line, said integrated circuit comprising:

first clock input line means for receiving a first clock signal;

second clock input line means for receiving a second clock signal, with said first and second clock signals being non-overlapping with respect to one another;

data input inverter means for inverting an input signal received on the data input line;

first n-channel gating transistor means for gating a signal output from said data input inverter means based upon a state of the first clock signal;

first data storage inverter means for inverting a signal output of said first n-channel gating transistor means;

second n-channel gating transistor means for gating a signal output from said first data storage means based upon a state of the second clock signal;

second data storage inverter means for inverting a signal output from said second n-channel gating transistor means;

data output inverter means for inverting a signal output of said second data storage inverter means onto the data output line;

a first gated feedback inverter means for selectively inverting the signal output from said first data storage inverter means and for applying the selectively inverted signal to an input of the first data storage inverter means, said first gated feedback inverter means having a p-channel transistor, a first n-channel transistor and a second n-channel transistor connected serially in order with no other transistors between a voltage source and a ground, with said first n-channel transistor of said first gated feedback inverter means having a gate connected to said second clock input line means, said p-channel transistor and said second n-channel transistor of said first gated feedback inverter means having gates connected to an output of said first data storage inverter means, and said p-channel transistor of said first gated feedback inverter means having a drain connected to said input of said first data storage inverter means; and a second gated feedback inverter for selectively inverting the signal output from said second data storage inverter means and for applying the selectively inverted signal to an input of the second data storage inverter means, said second gated feedback inverter means having a p-channel transistor, a first n-channel transistor and a second n-channel transistor connected serially in order with no other transistors between the voltage source and the ground, with said first n-channel transistor of said second gated feedback inverter means having a gate connected to said first clock input line means, said p-channel transistor and said second n-channel transistor of said second gated feedback inverter means having gates connected to an output of said second data storage inverter means, and said p-channel transistor of said second gated feedback inverter means having a drain connected to said input of said second data storage inverter means.

7. The integrated circuit of claim 6 further comprising:

third clock input line means for receiving a third clock signal, with said second and third clock signals being non-overlapping with respect to one another;

serial-data input inverter means for inverting an input received from a serial-data input line;

third n-channel gating transistor means for gating a signal output from said serial-data input inverter means based upon a state of the third clock signal and applying the inverted signal to an input of said first data storage inverter means; and with said third clock input line means also connected to a gate of a fourth transistor having a drain connected to said drain of said p-channel transistor of said second gated feedback inverter means and a source connected to a drain of said second n-channel transistor of said second gated feedback inverter means.

8. The integrated circuit of claim 6 wherein said n-channel transistors provide less resistance than said p-channel transistors.

9. The integrated circuit of claim 6 wherein said data input inverter means includes a p-channel transistor and an n-channel transistor connected in series between said voltage source and said ground; and wherein said first n-channel gating transistor means and said n-channel transistor of said data input inverter means both have a greater ratio of width to length than said p-channel transistor of said first gated feedback inverter means.

10. The integrated circuit of claim 6 wherein said first data storage inverter means includes a p-channel transistor and an n-channel transistor connected in series between said voltage source and said ground; and wherein said second n-channel gating transistor means and said n-channel transistor of said first data storage inverter means both have a greater ratio of width to length than said p-channel transistor of said second gated feedback inverter means.

11. A method for storing data within an integrated circuit connected between a data input line and a data output line, said method comprising the steps of:

inverting an input signal received on the data input line to yield a first intermediate signal;

gating the first intermediate signal based upon a state of a first clock signal to yield a second intermediate signal;

inverting the second intermediate signal to yield a third intermediate signal;

gating the third intermediate signal based upon a state of a second clock signal to yield a fourth intermediate signal, with the first and second clock signals being non-overlapping with respect to one another;

inverting the fourth intermediate signal to yield a fifth intermediate signal;

inverting the fifth intermediate signal onto the data output line;

inverting the third intermediate signal using a first gated feedback inverter and feeding back the inverted third intermediate signal for combination with the second intermediate signal, said first gated feedback inverter having a p-channel transistor, a first n-channel transistor and a second n-channel transistor connected serially in order with no other transistors between a voltage source and a ground, with said first n-channel transistor of said first gated feedback inverter gated by the second clock signal; and inverting the fifth intermediate signal using a second gated feedback inverter and feeding back the inverted fifth intermediate signal for combination with the fourth intermediate signal, said second gated feedback inverter having a p-channel transistor, a first n-channel transistor and a second n-channel transistor connected serially in order with no other transistors between a voltage source and a ground, with said first n-channel transistor of said second gated feedback inverter gated by the first clock signal.

\* \* \* \* \*